United States Patent [19]

Chang et al.

[11] Patent Number: 5,182,521

[45] Date of Patent: Jan. 26, 1993

[54] TIME-MULTIPLEXED SWITCHED CAPACITOR CIRCUIT HAVING REDUCED CAPACITANCE

[75] Inventors: Joseph S. Chang, Clayton; Yit C. Tong, Burwood, both of Australia

[73] Assignee: The University of Melbourne, Parkville, Australia

[21] Appl. No.: 782,920

[22] Filed: Oct. 23, 1991

Related U.S. Application Data

[63] Continuation of Ser. No. 490,655, filed as PCT/AU88/00331, on Aug. 26, 1988, abandoned.

[30] Foreign Application Priority Data

Aug. 28, 1987 [AU] Australia ................. PI4081

[51] Int. Cl.$^5$ ............... H03B 1/00; H03K 5/00
[52] U.S. Cl. .................. 328/167; 307/521; 328/151
[58] Field of Search ........... 307/520, 521; 328/167, 328/127, 151; 330/9, 107; 333/173

[56] References Cited

U.S. PATENT DOCUMENTS

| | | | |
|---|---|---|---|
| 3,760,287 | 9/1973 | Harris | 330/9 |
| 4,365,204 | 12/1982 | Haque | 330/9 |
| 4,438,354 | 3/1984 | Haque et al. | 328/127 |
| 4,443,757 | 4/1984 | Bui | 333/173 |
| 4,453,258 | 6/1984 | Richardson | 333/173 |
| 4,543,546 | 9/1985 | Hariharan | 333/173 |
| 4,716,375 | 12/1987 | Van Roermand | 329/50 |
| 4,841,263 | 6/1989 | Mulawka et al. | 353/173 |
| 4,849,662 | 7/1989 | Holberg et al. | 328/167 |

FOREIGN PATENT DOCUMENTS

| | | |
|---|---|---|
| 0047409 | 3/1982 | European Pat. Off. |
| 77091 | 4/1983 | European Pat. Off. |
| 132885 | 2/1985 | European Pat. Off. |
| 209948 | 1/1987 | European Pat. Off. |
| 2043386 | 10/1980 | United Kingdom |
| 2084835 | 4/1982 | United Kingdom |
| 2085684 | 4/1982 | United Kingdom |

OTHER PUBLICATIONS

"A Multiplexed Switched Capacitor Filter Bank," by Bosshart, *IEEE Journal of Solid-State Circuits*, vol. SC-15, No. 6, pp. 939-945 (Dec., 1980).

"Simplified MOS Switched Capacitor Ladder Filter Structures," by Allstot et al. *IEEE Journal of Solid-State Circuits*, vol. SC-16, No. 6, pp. 724-728 (Dec. 1981).

"Strays-Insensitive State-Space Switched-Capacitor Filters", by El-Masry, *IEEE Transactions on Circuits and Systems*, vol. CAS-30, No. 7, pp. 474-488 (Jul. 1983).

Primary Examiner—Timothy P. Callahan
Attorney, Agent, or Firm—Merchant & Gould, Smith, Edell, Welter & Schmidt

[57] ABSTRACT

A time-multiplexed switched capacitor circuit in which certain capacitors are shared during local time periods of a global time period to allow the total capacitance of the circuit to be reduced. Corresponding savings in chip area in an integrated circuit implementation and component savings in a discrete implementation may be achieved. The invention is particularly applicable to a multiplexed circuit comprising an array of capacitors including first and second common capacitors and first and second pluralities of capacitors. The capacitors may be switched into and out of the multiplexed circuit during different local time periods. The first common capacitor may be switched into the circuit when any one of the first plurality of capacitors is involved in the operation of the multiplexed circuit thus reducing the size of that one capacitor of the first plurality of capacitors. In a similar fashion, the first and second common capacitors may be switched into the circuit when any one of the second plurality of capacitors is involved in the operation of the multiplexed circuit.

3 Claims, 6 Drawing Sheets

$$\frac{V_{out}(z)}{V_{in}(z)} = \frac{Jz^{-1}(1-z^{-1})}{(1+F) + z^{-1}(AU-F-2) + z^{-2}}$$

$$\frac{V_{out}(z)}{V_{in_1}(z)} = \frac{-AUz^{-1}}{(1+F) + z^{-1}(AU-F-2) + z^{-2}}$$

$$\frac{V_{out}(z)}{V_{in_2}(z)} = \frac{(A-F) + z^{-1}(-A+F+J) - Jz^{-2}}{(1+F) + z^{-1}(AU-F-2) + z^{-2}}$$

$$\left.\frac{V_{out}(z)}{V_{in_1}(z)}\right|_{z=1} = -1$$

$$\left.\frac{V_{out}(z)}{V_{in_2}(z)}\right|_{z=1} = 0$$

TIME-MULTIPLEXED SWITCHED CAPACITOR CIRCUIT HAVING REDUCED CAPACITANCE

This is a continuation of application Ser. No. 07/490,655, filed as PCT/AU88/00331, on Aug. 26, 1988, now abandoned.

The present invention relates to electrical circuits incorporating shared capacitors and more particularly to Time-Multiplexed Switched Capacitor circuits, such as filter banks, in which certain capacitors may be arranged to be shared.

The Switched Capacitor circuit of the present invention may be associated with developments disclosed in applicant's pending U.S. patent application Ser. No. 07/536,655 entitled SWITCHED CAPACITOR CIRCUITS, the specification of which are incorporated herein by cross reference.

Application of methodology according to the present invention may result in significant capacitor saving, simplified layout and interconnection allowing a substantial reduction in chip area in integrated circuit (monolithic) realizations. The noise performance of the circuit also may be improved.

As Switched Capacitor (SC) circuits are relatively efficient in terms of chip area and power dissipation for implementing monolithic filters, many complex on-chip systems requiring a large number of high order filters employ SC design techniques. An example of such a system is a spectrum analyzer for automatic speech recognition, vocoders, sensory aids for the deaf, and the like. The spectrum analyzer may comprise a Bandpass filter bank, a bank of Full-Wave Rectifiers, and a Lowpass filter bank.

As the need for complex on-chip systems grow, chip area and power dissipation remain major obstacles, especially when used in portable instruments. Techniques reported to date to alleviate these problems include application of micropower design techniques and Time-Multiplexing.

An object of the present invention is to address the chip area problem in prior art SC filters and filter banks, and to offer a capacitor sharing technique which may reduce chip area due to capacitors, simplify layout and interconnection, and improve noise performance.

It is of interest to note that as chip area in most monolithic SC filters is predominantly due to capacitors, the approach to the present invention is attractive. This advantage becomes even more apparent because minimum valued capacitors are desirable for noise consideration reasons as technology (minimum feature in a given MOS process) scales down. Thus, the area used for realizing capacitors becomes increasingly dominant. The present invention may be applicable to a Bandpass filter bank for a spectrum analyzer which may be compatible with micropower and Time-Multiplexed designs.

To facilitate understanding of the present invention, an introduction to circuit elements employed in the realization of SC filters and filter banks is given. A second order filter is termed a biquadratic filter section (biquad). Synthesis of high order filters typically employ biquads as their workhorse where these filters are often realized as a cascade of biquads. SC filters comprise operational amplifiers (op amps), capacitors, and switches controlled by clock signals. A capacitor and its associated switches is termed a Capacitor Switch Network (CSN).

The transfer function of a SC filter may be specified by clock frequency, capacitor ratios and circuit topology. All useful SC circuits preferably are parasitic insensitive or at least parasitic compensated. Clock signals used in implementing SC circuits depend on the realization method adopted. Most Time-Multiplexed SC filters and filter banks employ a single biphasic clock and a number of local clock periods. The biphasic clock may comprise non-overlapping even (half) and odd (half) clock phases. A global clock period (inverse of the sampling frequency) is divided into a number of non-overlapping local clock periods. In this case, a different SC subcircuit, usually one channel of a filter bank, may be serviced in a local clock period. The odd (or even) phase of the biphasic clock may coincide with the first half of the local clock period, while the even (or odd) phase may coincide with the latter half of the local clock period.

The smallest capacitor in a monolithic SC circuit may be (typically) 0.3 picofarad and is termed a unity (valued) capacitor. In view of the precision required in matching of capacitor ratios, each capacitor in a monolithic realization preferably is made up of a number of unity capacitors and an additional non-integer capacitor having a value between unity and two (unit capacitors). For example, if a capacitor of 3.5 units is desired, 2 unity capacitors and a 1.5 non-integer capacitor are combined.

Integrating capacitors are capacitors that are connected across the output and inverting input terminals of an op amp. Integrating capacitors may be switched in during the entire local clock period in time-Multiplexed circuits. All other capacitors are non-integrating capacitors which are charged and discharged by means of a biphasic clock signal during a local clock period.

Generally speaking integrating capacitors are required for individual biquads in Time-Multiplexed filters because they are used to retain the state of the filter. Thus, with some exceptions, integrating capacitors may not be shared between Time-Multiplexed biquads. Non-integrating capacitors, on the other hand, may be shared between all Time-Multiplexed biquads. This is because they may be designed such that they do not retain charge information pertaining to the previous Time-Multiplexed biquad (except where they are designed to do so in special cases where input/output CSNs transfer charge from one Time-Multiplexed biquad to the next).

Synthesis of a SC filter may include dynamic range and capacitor scaling. The former may involve scaling the closed-loop gains of each op amp such that the output of all op amps peak to a fixed predefined value; hence optimizing dynamic range. The latter may involve scaling the values of a set of capacitors which have one of their terminals connected to the non-inverting input of an op amp. The smallest capacitor of that set may be assigned a unity value as previously described. In this manner, the total capacitance required may be optimized (to a minimum).

Capacitors of a SC Bandpass filter bank generally are unequal for different channels due to the varied transfer function requirements of the different channels. One prior art design method involves use of resistive strings to provide required voltage division such that capacitor values are made equal for all channels. However this method is undesirable for micropower on-chip systems because resistors require large chip areas, dissipate considerable power and result in long time constants which in turn limits high speed operation. It has also been argued that by using these resistive strings, the DC offset (due to non-idealities) may be made equal for all filter channels. However this result may be achieved simply by careful design of the filter transfer function so that the DC (frequency) transfer functions from the input of each op amp to the biquad output are equal for all channels; hence not requiring resistive strings. A biquad design having this feature will be described later.

The present invention may provide an improved capacitor sharing arrangement by means of which the total capacitance or total number of unit capacitors required in a circuit may be significantly reduced. The advantages of the present invention may be achieved without incurring significant overheads, such as, many additional clocking signals.

The present invention may provide in one form a switched capacitor circuit including a multiplicity of capacitors and switches. The multiplicity of capacitors may include a first plurality of capacitors and a second plurality of capacitors. A first common capacitor may be shared by the first and second plurality of capacitors and a second common capacitor may be shared by the said second plurality of capacitors.

The above arrangement may permit the total capacitance of the circuit to be significantly reduced thereby enabling corresponding savings in chip area in integrated circuits and component savings in discrete component circuits. Put in other words, because the values of individual capacitors in the first plurality of capacitors is reduced by the size of the first common capacitor, and the value of individual capacitors in the second plurality of capacitors is reduced by the combined value of the said first and second common capacitors, the total capacitance in a given capacitor array may be significantly reduced.

The present invention is particularly applicable to multiplexed circuits comprising an array of capacitors including first and second common capacitors and first and second pluralities of capacitors. The capacitors may be switched into and out of different multiplexed time periods of the multiplexed circuits. The first common capacitor may be switched into the circuit when any one of the first plurality of capacitors is involved in the operation of the multiplexed circuit thus reducing the size of that one capacitor of the first plurality of capacitors. In a similar fashion, the first and second common capacitors may be switched into the circuit when any one of the second plurality of capacitors is involved in the operation of the multiplexed circuit.

The capacitor sharing arrangement of the present invention may be advantageously applied to non-integrating capacitors in the circuit and in special cases, integrating capacitors.

The capacitor sharing arrangement of the present invention may allow the number of non-integrating capacitors in a capacitor array to be substantially reduced. The arrangement increases the extent of capacitor sharing and may result in simplified layout and possible improvement in noise performance of the circuit.

According to one aspect of the present invention there is provided a Time-Multiplexed Switched Capacitor circuit having a multiplicity of capacitors; at least one of said capacitors being adapted to be switched into and out of said circuit during at least some local time periods of a global time period, said circuit including: an array comprising at least one capacitor; and a common capacitor adapted to be switched into said circuit during a plurality of local time periods fewer than the number of local time periods in said global time period; such that said common capacitor is shared by said at least one capacitor of said array during said plurality of local time periods.

According to a further aspect of the present invention there is provided a Switched Capacitor circuit having a multiplicity of capacitors and associated switches adapted to switch said capacitors into and out of said circuit, said multiplicity of capacitors including a first plurality of capacitors, a second plurality of capacitors, a first common capacitor adapted to be shared by at least one of said first and said second pluralities of capacitors and a second common capacitor adapted to be shared by said at least one of said second plurality of capacitors.

According to a still further aspect of the present invention there is provided a Time-Multiplexed circuit comprising a multiplicity of elements adapted to be switched into and out of said circuit during at least some local time periods of a global time period, said circuit including a first array of elements, a second array of elements, a first common element adapted to be switched into said circuit during said global time period such that said first common element is shared by at least one element of said first and second arrays during said global time period and a second common element adapted to be switched into said circuit during a plurality of local time periods fewer than the number of local time periods in said global time period such that said second common element is shared by at least one element of said second array during said plurality of local time periods.

According to a still further aspect of the present invention there is provided a Time-Multiplexed circuit comprising a multiplicity of elements and associated switches adapted to switch said elements into and out of said circuit during at least some local time periods of a global time period, said multiplicity of elements including a first plurality of elements, a second plurality of elements, a first common element which is adapted to be shared by at least one of said first and second pluralities of elements during said global time period and a second common element which is adapted to be shared by at least one of said second plurality of elements during a plurality of local time periods fewer than the number of local time periods in said global time period.

The present invention will be described with particular reference to embodiments comprising a Time-Multiplexed SC Bandpass filter bank of a spectrum analyzer. Although the present invention is to be described with reference to a Bandpass filter bank, it is to be appreciated that the invention is not thereby limited to such applications. In addition, single ended output op amps will only be employed, but extensions to include differential output op amps will be obvious to persons skilled in the art.

In one embodiment, the present invention may provide a fourth order per channel 24-channel Bandpass filter bank. The fourth order per channel 24-channel Bandpass filter bank may comprise a cascade of two Time-Multiplexed biquads. Clocking signals may comprise 24 local clock periods wherein one filter channel is serviced in one local clock period; a biphasic clock comprising non-overlapping even and odd phases; and an additional clock period. Each Time-Multiplexed biquad may comprise two op amps, 5 CSN arrays and 1 CSN. Three CSN arrays may each comprise 24 capacitors and associated switches. One CSN array may comprise 26 capacitors and associated switches. The remaining CSN array may comprise 2 capacitors and associated switches.

Preferred embodiments of the present invention will now be described with reference to the accompanying drawings wherein:

FIGS. 3($a_1$) and 3($a_2$) show schematic diagrams of two Time Multiplexed biquads embodying the principles of the present invention.

Figure 1A:
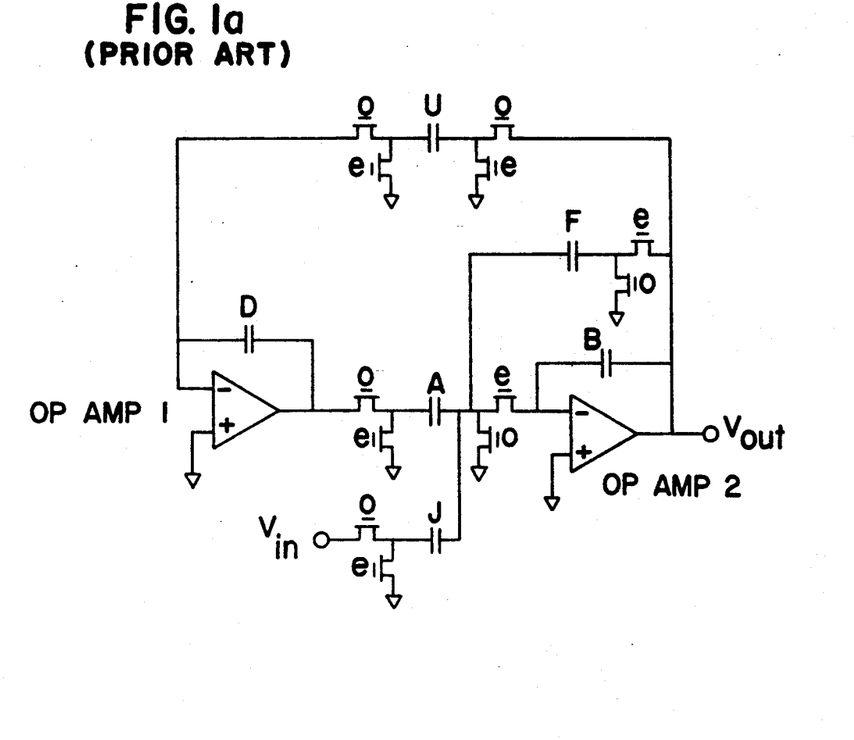
FIG. 1(a) is a circuit diagram of an unmultiplexed biquad to which the present invention may be applied.
Figure 1B:
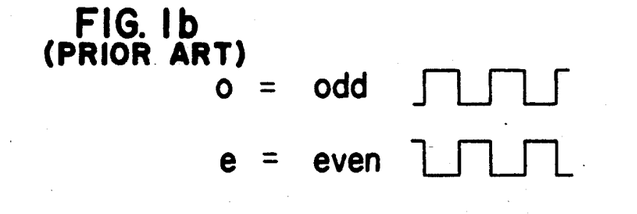
FIG. 1(b) shows the biphasic clock used in the circuit of FIG. 1(a)

Consider the unmultiplexed Bandpass biquad depicted in FIG. 1(a) clocked by a biphasic clock as shown in FIG. 1(b). The biquad comprises op amps 1 and 2 and CSNs 'A', 'B', 'D', 'F', 'J' and 'U'. The integrating capacitor of CSN 'D' is connected across the inverting input and output terminals of op amp 1. The non-integrating capacitor of CSN 'A' has one terminal connected to the output of op amp 1 and the other terminal connected to the inverting input of op amp 2. The non-integrating capacitor of CSN 'J' has one terminal connected to the input of the biquad and the other terminal connected to the inverting input of op amp 2. The integrating capacitor of CSN 'B' and non-integrating capacitor of CSN 'F' are connected across the inverting input and output of op amp 2. The non-integrating capacitor of CSN 'U' has one terminal connected to the output of op amp 2 and the other terminal connected to the inverting input of op amp 1. The output of op amp 2 (V out) is the output of the biquad. The transfer function of the Bandpass biquad of FIG. 1(a) is given in FIG. 1(c).

As a general approach, the op amps of the biquad may be Time-Multiplexed to service different channels of a filter bank by simply connecting different capacitors pertaining to the relevant channels during the appropriate times. This general approach would subsequently require 2 op amps and 6 CSN arrays. However in a practical Time-Multiplexed biquad design, the number of CSN arrays may be reduced so that overall hardware savings due to Time-Multiplexing are op amps and capacitors. A practical implementation using prior art techniques is referred to for comparative purposes.

Figure 2A:
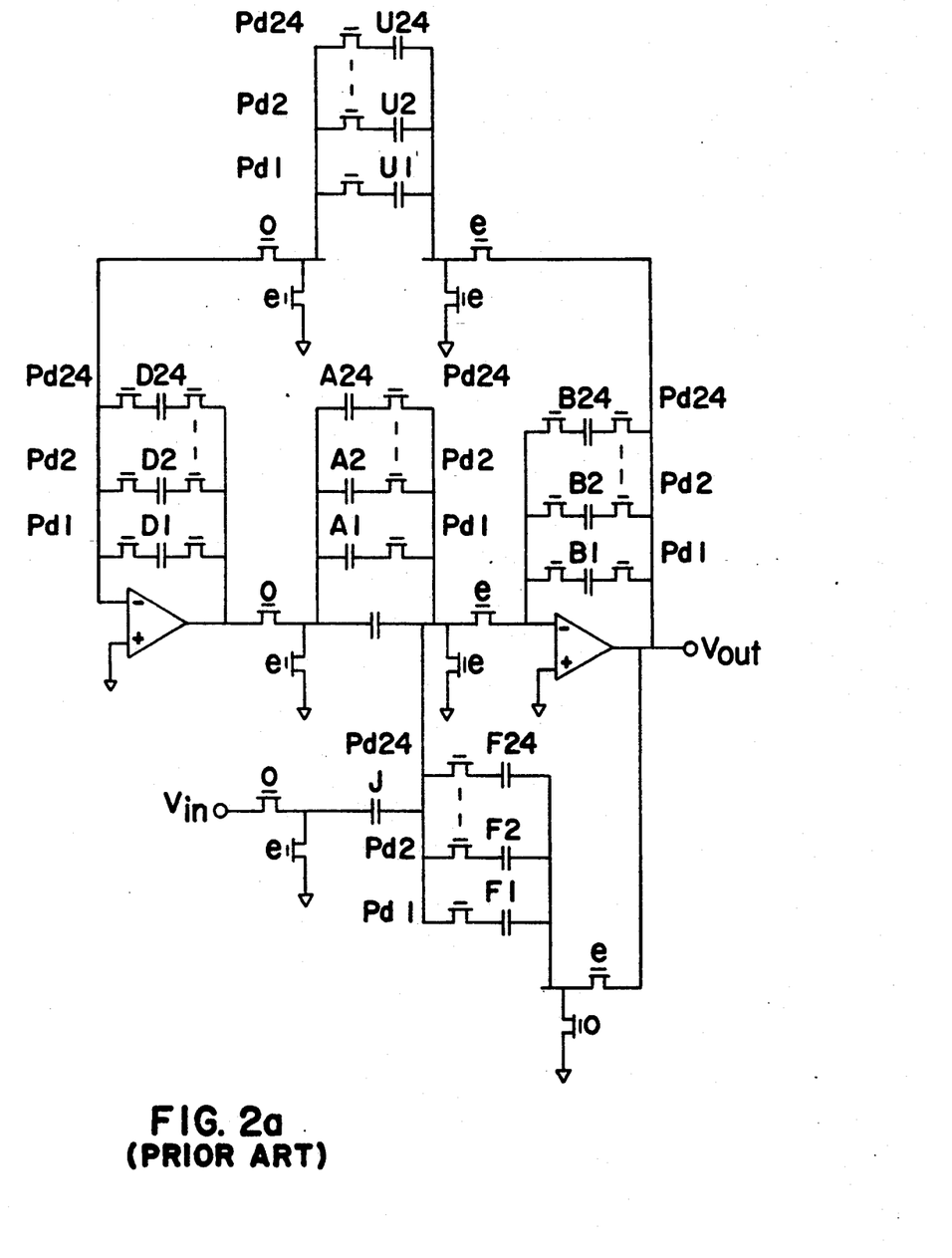
FIG. 2(a) is a schematic diagram of a 24-channel Time-Multiplexed biquad utilizing prior art techniques.

Several observations may be made with reference to a biphasic clock definition for the biquad shown in FIG. 1(a) and its Time-Multiplexed version shown in FIG. 2(a). The latter uses clock signals depicted in FIG. 2(b). Non-integrating capacitors of CSNs 'A' and 'J' are discharged to virtual ground of an op amp and non-integrating capacitor of CSN 'U' is discharged to analog ground during the even phase of the biphasic clock, or equivalently, the latter half of the local clock period. Non-integrating capacitors of CSN 'F', on the other hand, are discharged to analog ground during the odd phase. In this fashion, states of the previous Time-Multiplexed biquad are not retained by non-integrating capacitors because these capacitors are discharged before they sample new values in a given local clock period, and hence they may be shared by all Time-Multiplexed biquads as noted at the outset in this specification.

As every channel of the Bandpass filter bank has a different transfer function, most integrating and non-integrating capacitors have different values. The values of capacitors for several filter channels are tabulated in Table 1. Dynamic range and capacitor scaling have been performed in this case.

TABLE 1

CAPACITOR VALUES OF BIQUAD IN BAND-PASS FILTERBANK USING PRIOR ART TIME-MULTIPLEXED DESIGN TECHNIQUES
Common Capacitor AO = 1.

| Channel | A | B | D | F | J | U |
|---|---|---|---|---|---|---|
| 1 | 1.92 | 21.07 | 7.62 | 1.00 | 1.00 | 1.00 |
| 2 | 3.07 | 20.08 | 5.13 | 1.00 | shared | 1.00 |
| 6 | 7.71 | 19.04 | 2.25 | 1.02 | shared | 1.00 |
| 9 | 12.34 | 19.17 | 1.60 | 1.04 | shared | 1.00 |
| 10 | 12.56 | 19.24 | 1.46 | 1.04 | shared | 1.00 |
| 14 | 14.32 | 15.41 | 1.04 | 1.09 | shared | 1.00 |
| 15 | 14.39 | 14.15 | 1.00 | 1.11 | shared | 1.05 |
| 20 | 15.46 | 9.97 | 1.00 | 1.38 | shared | 1.55 |

It may be seen in Table 1 that as only the value of the capacitor of CSN 'J' remains invariant, it may be shared by all filter channels. Consequently, 5 CSN arrays are required for the other 5 CSNs of the Time-Multiplexed biquad. Several other observations can be made with reference to Table 1. Capacitors of CSN array 'F' are small but unequal for most filter channels, hence these are individually realized in a CSN array. Capacitors of CSN array 'A', on the other hand, vary dramatically where their values become larger as the ratio of the centre frequency to sampling frequency approaches the Nyquist limit. Individual integrating capacitors of CSN arrays 'B' and 'D' are also required for individual filter channels as they retain the state of the filter channels.

Figure 2B:
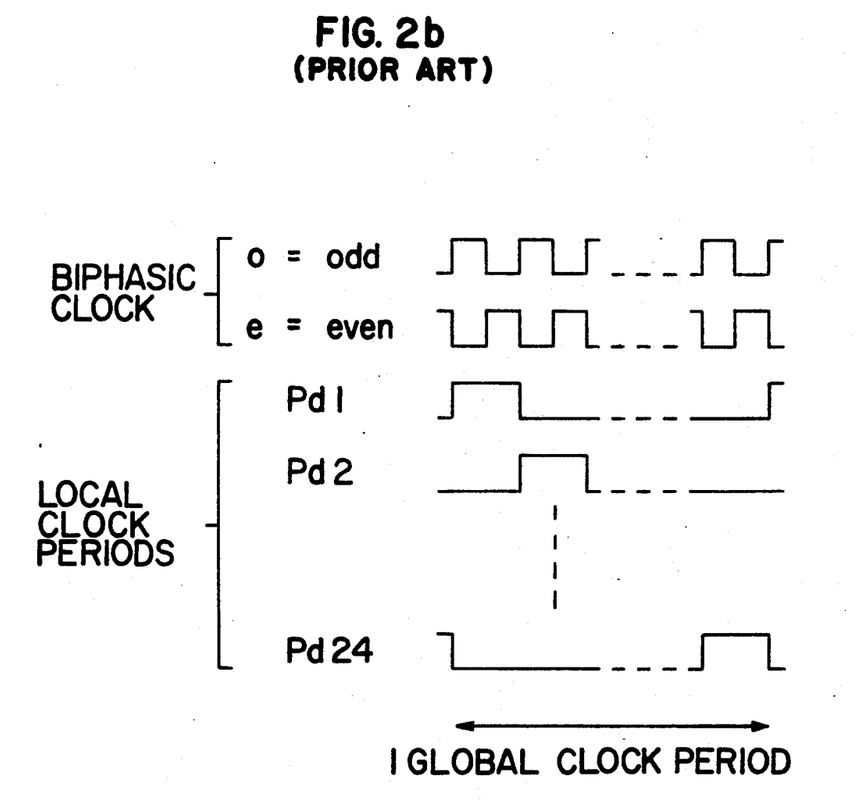
FIG. 2(b) shows the clocking signal used in the filter bank realization of FIG. 2(a)

It is noted that as the minimum capacitor value of CSN array 'A' of the Time-Multiplexed biquad is 2.92 unit capacitors (refer Table 1: 'A'='A1'+'A0'), CSN array 'A' is designed such that a common capacitor 'A0' of 1 unit is shared by all channels. With reference to FIGS. 2(a) and 2(b) the operation of this CSN array is as follows. During the first local clock period Pd 1 when channel 1 of the Bandpass filter bank is serviced, capacitor 'A1' is connected in parallel with common capacitor 'A0' so that 'A0' plus 'A1' sums to the required value of the non-integrating capacitor for CSN array 'A' pertaining to the specifications of channel 1. To this end, the value of capacitor of CSN 'A' for channel 1 [capacitor 'A1' in FIG. 2(a)] is 1.92 (refer Table 1). In the following local clock period Pd 2, capacitor 'A1' is disconnected and 'A2' connected in parallel with common capacitor 'A0' such that 'A0' plus 'A2' sums to the required value of the non-integrating capacitor of CSN 'A' pertaining to channel 2. This process is repeated for all channels concerned.

It may be appreciated from Table 1 that because the capacitors shared as a result of Time-Multiplexing only includes unit valued capacitor of CSN 'J' and common capacitor 'A0', the overall capacitor saving is small. The sharing of capacitor 'A0' results in a saving of 23 unit capacitors out of the required 260 units (or 9%) in CSN array 'A' or 760 units (or 3%) in the complete Time-Multiplexed biquad. It is noted that CSN array 'A' makes up a substantial 34% of the total capacitance of the biquad.

From Table 1, it may be seen that the capacitor of CSN 'U' is the smallest capacitor (unity valued) associated with the inverting input of op amp 1 in channels 1 to 14 of the Time-Multiplexed Bandpass biquad, after which the integrating capacitor of CSN 'D' becomes unity valued. As the value of capacitors of CSN 'U' does not remain invariant for all channels, unlike 'J', it may not be shared. Consequently, individual capacitors for CSN 'U' are required for each filter channel (as tabulated in Table 1).

Figure 1C:
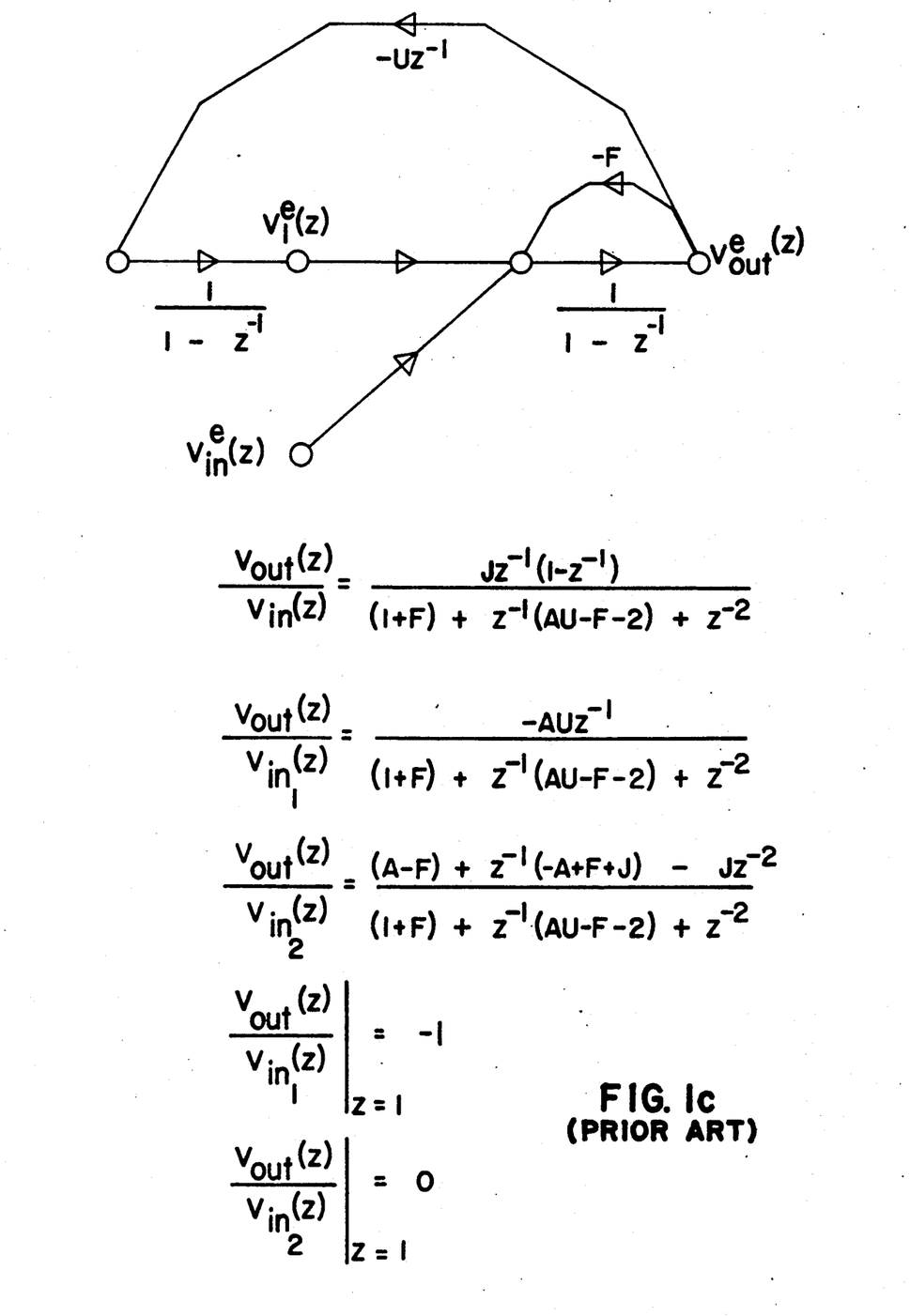
FIG. 1(c) depicts the signal-flow-graph associated with the circuit of FIG. 1(a), its transfer function characteristics, and DC (frequency) transfer functions from the input of op amp 1 and op amp 2 to the output of the biquad.

As depicted in FIG. 1(c), the DC (frequency) transfer function from the input of op amp 1 and op amp 2 to the output of the biquad are $-1$ and 0 respectively. Hence, from the DC transfer function viewpoint, the DC offsets for this Time-Multiplexed Bandpass biquad are independent of capacitor ratios. Hence DC offsets between the different Time-Multiplexed Bandpass filter channels may be made small without the use of resistive strings. It is further worthwhile to note that when one op amp of the biquad in FIGS. 1(a) or 2(a) samples an input, its output is not sampled by another op amp during the same phase of a biphasic clock. This biquad design is therefore compatible with micropower as speed requirements of the op amp are relaxed.

A fourth order per channel 24-channel Bandpass filter bank may comprise a cascade of two Time-Multiplexed biquads shown in FIG. 2(a).

Figure 3A:
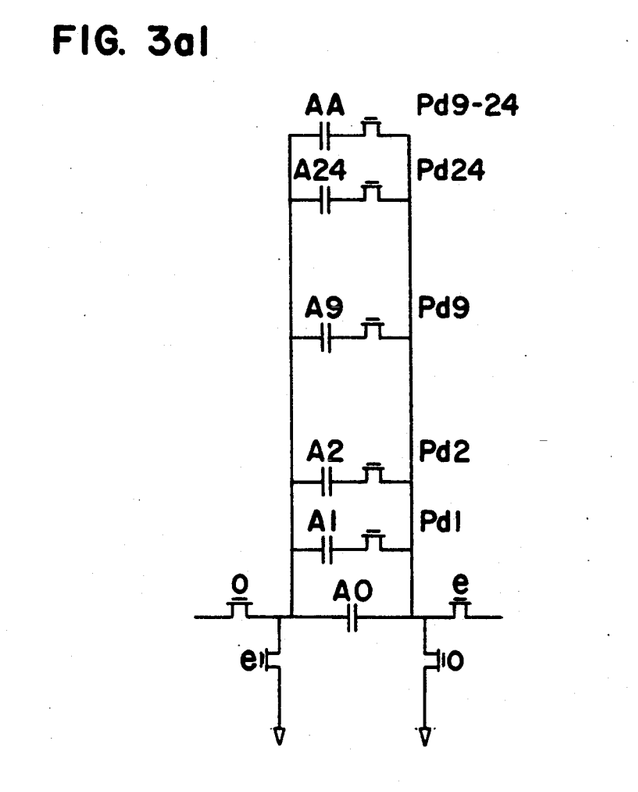

Referring to FIG. 3, the capacitor sharing technique embodying the present invention will now be described with reference to CSN arrays 'A' and 'U'. Consider CSN array 'A' first. Capacitor sharing may be enhanced by connecting a second common capacitor 'AA' during periods Pd 9 to Pd 24 so that the residual required capacitors 'A9' to 'A24' are reduced by both the common capacitors 'A0' and 'AA'. The modified CSN array 'A' is depicted in FIG. 3($a_1$). In this case, capacitors 'A0' plus 'AA' plus 'Ax' (x denoting the relevant multiplexed channel 9-24) sums to the specified value capacitor for CSN 'A' of that channel. The values of the modified 'A' CSN array is depicted in Table 2 below.

TABLE 2

| CAPACITOR VALUES OF BIQUAD IN BAND-PASS FILTERBANK UTILIZING THE CAPACITOR SHARING TECHNIQUE OF THE PRESENT INVENTION ||||||||
|---|---|---|---|---|---|---|---|
| First Common Capacitor ||||| AO = 1; |||
| Second Common Capacitor ||||| AA = 11; |||
| First Common Capacitor ||||| UO = 1; |||
| Second Common Capacitor ||||| UU = 1. |||
| Channel | A | B | D | F | J | U |
| 1 | 1.92 | 21.07 | 7.62 | 1.00 | 1.00 | 1.00 |
| 2 | 3.07 | 20.08 | 5.13 | 1.00 | shared | shared |
| 6 | 7.71 | 19.04 | 2.25 | 1.02 | shared | shared |
| 9 | 1.34 | 19.17 | 3.19 | 1.04 | shared | 2.00 |
| 10 | 1.56 | 19.24 | 2.29 | 1.04 | shared | shared |
| 14 | 3.32 | 15.41 | 2.08 | 1.09 | shared | shared |
| 15 | 3.39 | 14.15 | 1.91 | 1.11 | shared | shared |
| 20 | 4.46 | 9.97 | 1.29 | 1.38 | shared | shared |

As an example of the benefit provided by the enhanced capacitor sharing methodology of the present invention, consider channel 9. The required value of capacitor for CSN 'A' is 13.34 (refer Table 1: 'A'='A0'+'A9'). By employing the present invention, 'AA' assumes a value of 11 unit capacitors while 'A0' remains as a unit capacitor. Consequently, 'A9' becomes 1.34 indicated in Table 2. Capacitor values of 'Ax' for channels 10 to 24 are reduced in a similar fashion.

Figure 3A:
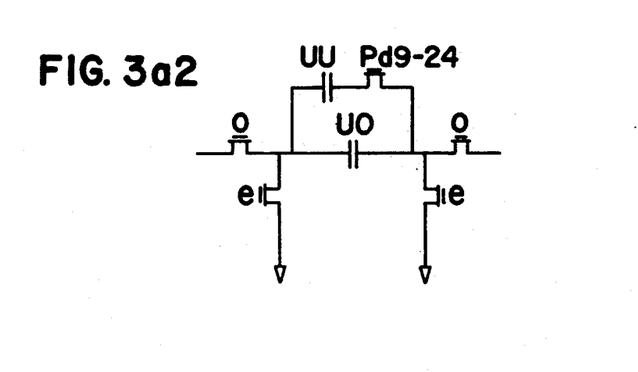
Figure 3B:
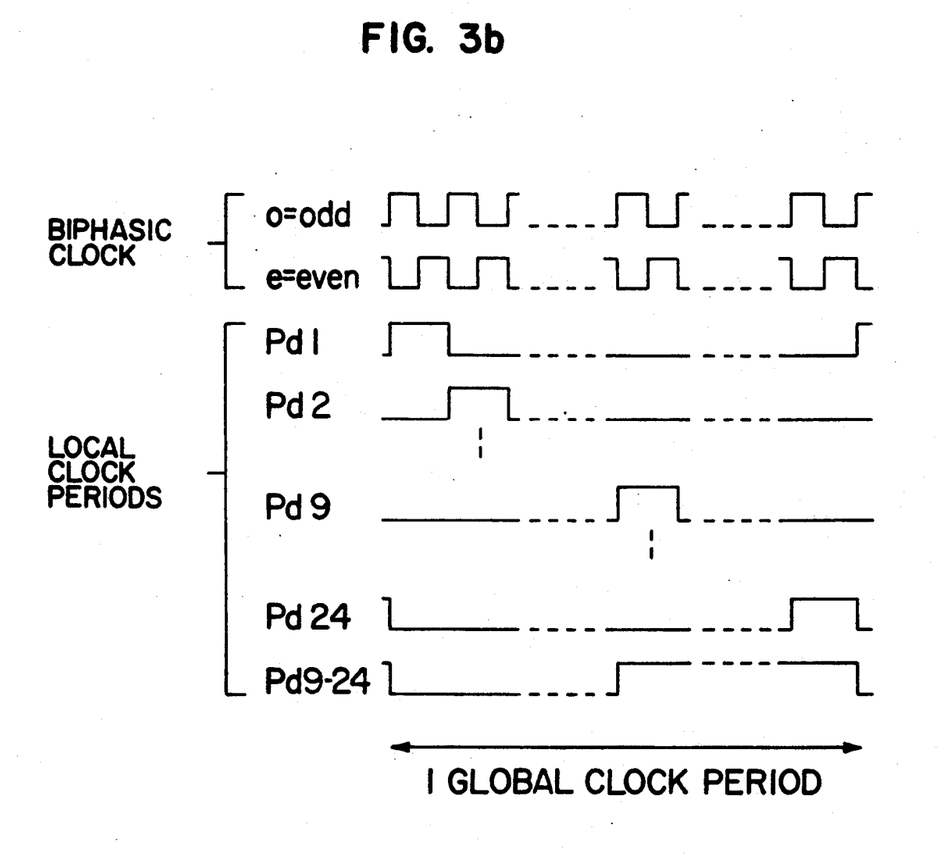
FIG. 3(b) shows the clocking signals used in the present invention depicted in FIGS. 3($a_1$) and 3($a_2$).

The second common capacitor 'AA' is connected in circuit by means of an additional clock signal Pd 9-24 which goes high during Pd 9 and low at the end of Pd 24 (refer FIG. 3(b)). As the second common capacitor 'AA' is shared between channels 9 to 24, the total number of unit capacitors required for CSN array 'A' is reduced by a notable 165 units. This represents a 23% reduction of the total number of capacitors for the biquad (or a 65% reduction of CSN array 'A'). In the case of an actual integrated circuit layout the area reduction may be of the order of 15% for the Time-Multiplexed biquad. The lower figure accounts for an area due to interconnections and the fact that layout is designed to be modular where the area allocated for capacitors for every channel is equal.

Consider now the application of the capacitor sharing technique of the present invention to CSN array 'U'. This latter array now comprises 2 CSNs instead of 24. As shown in FIG. 3($a_2$), 'UO' is the first common capacitor, and corresponds to 'AO' of CSN array 'A' in FIG. 3($a_1$). This is possible because during Pd 1 to Pd 8, the capacitor of CSN 'U' is the smallest capacitor at the inverting input of op amp 1, as shown in Tables 1 and 2. As a result of capacitor scaling, the capacitor of CSN 'U' becomes a unity valued common capacitor 'UO' which participates in servicing channels 1 to 8 [in contrast, individual unit capacitors of CSN array 'U' were required in prior art techniques depicted in FIG. (2a)]. During Pd 9 to Pd 24, a second common unit capacitor 'UU' is connected in parallel with 'UO', hence the capacitor of CSN 'U' becomes 2 unit capacitors. Other capacitors whose one terminal is connected to the inverting input of op amp 1, in this case capacitors of CSN 'D', are adjusted accordingly as depicted in Table 2. At this juncture, it should be appreciated that 'UO' is shared by all channels and 'UU' shared by channels 9 to 24.

Three advantages are achieved as a consequence of this sharing of capacitors 'UO' and 'UU'. First, the layout and interconnection in a monolithic implementation is simplified as the number of capacitors in the 'U' CSN array is reduced. Second, some capacitors are saved, hence chip area requirements are reduced. To quantify the saving, it is first remarked that it is good practice that integrating capacitors have a minimum value of 1 picofarad (typically 3 or more unit capacitors) for noise consideration reasons, predominantly kT/C noise. With this consideration, the total area saving may be of the order of 5% for a complete Time-Multiplexed biquad.

Third, it may be appreciated that as a result of the sharing of capacitor 'UU', some integrating capacitors of CSN array 'D' will assume a larger value (refer Tables 1 and 2). In view of the noise considerations discussed above, the noise performance of the circuit may improve correspondingly with larger capacitors in CSN array 'D'.

The only penalty associated with employment of the capacitor sharing methodology of the present invention is the need for an additional clocking signal Pd 9-24. However this clock signal is easily generated as it is a simple combinational logic of Pd 9 and Pd 24. This penalty is therefore insignificant compared to the advantages attained. The total chip area saving for the Time-Multiplexed biquad embodying the principles of the present inventin may be expected to be of the order of 20% in a monolithic implementation.

A fourth order per channel Bandpass filter bank may comprise a cascade of two Time-Multiplexed biquads each of which may comprise the Time-Multiplexed biquad depicted in FIG. 3(a).

An experimental Time-Multiplexed SC Spectrum Analyzer including the Bandpass Filter Bank embodying the invention has been fabricated using a 5 micron double polysilicon CMOS process. The experimental results obtained agree with theoretical predictions, confirming the advantages of the present invention.

In conclusion, the capacitor sharing methodology of the present invention may provide for significant capacitor saving, simplification of layout and interconnection, and improved noise performance.

While the preferred embodiment described above relates to a Time-Multiplexed biquad for a Bandpass filter bank of a spectrum analyzer, it should be appreciated that any circuit in which capacitor sharing is required may usefully utilize the present invention.

Since modifications within the spirit and scope of the invention may be readily effected by persons skilled in the art, it is to be understood that the invention is not limited to the particular embodiment described, by way of example, hereinabove.

We claim:

1. An n-channel Switched Capacitor filter realized as a time multiplexed circuit and operative during n respective time periods to service respective channels of the filter, where n is an integer greater than 1, said filter having an input and an output and comprising:

first and second operational amplifiers, each operational amplifier having an inverting input, a non-inverting input and an output, said filter input being sampled during each of said time periods by the inverting input of said second operational amplifier and said filter output being provided at the output of the second operational amplifier, said output of said second operational amplifier being operatively applied to said inverting input of said first operational amplifier;

a first common capacitor;

a second common capacitor;

an array of n capacitors, respective capacitors of said array corresponding to respective channels of said filter, said array including a first plurality of $n_0$ capacitors corresponding to $n_0$ channels and a second plurality of $n_1$ capacitors corresponding to $n_1$ channels, where $n_0 + n_1 = n$;

first means operable during respective time periods corresponding to the $n_0$ channels for connecting respective capacitors of said first plurality between the output of said first operational amplifier and the inverting input of said second operational amplifier;

second means operable during respective time periods corresponding to the $n_0$ channels for connecting said first common capacitor between the output of said first operational amplifier and the inverting input of said second operational amplifier, so that during said respective time periods corresponding to the $n_0$ channels, said first common capacitor is connected in parallel with said respective capacitors of said first plurality;

third means operable during respective time periods corresponding to the $n_1$ channels for connecting respective capacitors of said second plurality between the output of said first operational amplifier and the inverting input of said second operational amplifier; and fourth means operable during respective time periods corresponding to the $n_1$ channels for connecting said first and said second common capacitors between the output of said first operational amplifier and the inverting input of said second operational amplifier, so that during said respective time periods corresponding to the $n_1$ channels, said first and said second common capacitors are connected in parallel with said respective capacitors of said second plurality, thereby reducing the total capacitance required in said filter.

2. A filter according to claim 1 further including:

a shared capacitor;

a further array of n capacitors, respective capacitors of said further array corresponding to respective channels of said filter;

fifth means operable during respective time periods corresponding to the n channels for connecting respective capacitors of said further array between the output of said second operational amplifier and the inverting input of said first operational amplifier;

sixth means operable during respective time periods corresponding to the n channels for connecting said shared capacitor between the output of said second operational amplifier and the inverting input of said first operational amplifier, so that during said respective time periods corresponding to the n channels, said shared capacitor is connected in parallel with said respective capacitors of said further array, thereby further reducing the total capacitance required in said filter.

3. A filter according to claim 1 further including:

a first shared capacitor;

a second shared capacitor;

a further array of n capacitors, respective capacitors of said further array corresponding to respective channels of said filter, said further array including a first plurality of $n_2$ capacitors corresponding to $n_2$ channels and a second plurality of $n_3$ capacitors corresponding to $n_3$ channels, where $n_2 + n_3 = n$;

fifth means operable during respective time periods corresponding to the $n_2$ channels for connecting respective capacitors of said first plurality in said further array between the output of said second operational amplifier and the inverting input of said first operational amplifier;

sixth means operable during respective time periods corresponding to the $n_2$ channels for connecting said first shared capacitor between the output of said second operational amplifier and the inverting input of said first operational amplifier, so that during said respective time periods corresponding to the $n_2$ channels, said first shared capacitor is connected in parallel with said respective capacitors of said first plurality in said further array;

seventh means operable during respective time periods corresponding to the $n_3$ channels for connecting respective capacitors of said second plurality in said further array between the output of said second operational amplifier and the inverting input of said first operational amplifier; and eighth means operable during respective time periods corresponding to the $n_3$ channels for connecting said first and said second shared capacitors between the output of said second operational amplifier and the inverting input of said first operational amplifier, so that during said respective time periods corresponding to the $n_3$ channels, said first and said second shared capacitors are connected in parallel with said respective capacitors of said second plurality in said further array, thereby further reducing the total capacitance required in said filter.

* * * * *